US010032658B2

(12) United States Patent
Kimura et al.

(10) Patent No.: US 10,032,658 B2
(45) Date of Patent: Jul. 24, 2018

(54) MANUFACTURING METHOD OF SEMICONDUCTOR DEVICE AND SEMICONDUCTOR MANUFACTURING APPARATUS

(71) Applicant: Toshiba Memory Corporation, Minato-ku (JP)

(72) Inventors: Shinsuke Kimura, Yokkaichi (JP); Yoshihiro Ogawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/724,744

(22) Filed: Oct. 4, 2017

(65) Prior Publication Data

US 2018/0040490 A1 Feb. 8, 2018

Related U.S. Application Data

(60) Continuation of application No. 15/408,554, filed on Jan. 18, 2017, now Pat. No. 9,818,627, which is a
(Continued)

(30) Foreign Application Priority Data

Jan. 18, 2013 (JP) .................. 2013-007296

(51) Int. Cl.
*H01L 21/02* (2006.01)
*H01L 21/67* (2006.01)
(Continued)

(52) U.S. Cl.
CPC .......... *H01L 21/67051* (2013.01); *B08B 3/08* (2013.01); *B08B 7/0057* (2013.01); *H01L 21/67057* (2013.01)

(58) Field of Classification Search
CPC ......... H01L 21/02164; H01L 21/28202; H01L 21/31612; H01L 21/02043;
(Continued)

(56) References Cited

U.S. PATENT DOCUMENTS 7,749,909 B2 7/2010 Tomita et al.
9,583,331 B2 * 2/2017 Kimura ............. H01L 21/67028
(Continued)

FOREIGN PATENT DOCUMENTS

JP 2010-114414 5/2010
JP 2010-192879 9/2010
(Continued)

OTHER PUBLICATIONS

Japanese Office Action dated Mar. 15, 2016 in Patent Application No. 2013-007296 (w/English translation).
(Continued)

*Primary Examiner* — Christine Enad
(74) *Attorney, Agent, or Firm* — Oblon, McClelland, Maier & Neustadt, L.L.P.

(57) ABSTRACT

A manufacturing method of a semiconductor device according to the present invention comprises cleaning a semiconductor substrate. A first chemical liquid for forming a water-repellent protection film and a second chemical liquid coating the first chemical liquid are supplied on a surface of the semiconductor substrate. Alternatively, the semiconductor substrate is immersed in the first chemical liquid coated with the second chemical liquid. The semiconductor substrate is then dried.

14 Claims, 6 Drawing Sheets

Related U.S. Application Data division of application No. 13/957,697, filed on Aug. 2, 2013, now Pat. No. 9,583,331.

(51) Int. Cl.
 *B08B 7/00* (2006.01)
 *B08B 3/08* (2006.01)

(58) Field of Classification Search
 CPC ......... H01L 21/02052; H01L 21/67051; H01L 21/6715; H01L 21/67057
 See application file for complete search history.

(56) References Cited

U.S. PATENT DOCUMENTS

| | | | |
|---|---|---|---|
| 2001/0018266 A1* | 8/2001 | Jiang | H01L 21/288 438/678 |
| 2004/0187896 A1* | 9/2004 | Konishi | B08B 3/024 134/33 |
| 2006/0219259 A1* | 10/2006 | Oh | C23G 1/10 134/2 |
| 2008/0241489 A1 | 10/2008 | Ishibashi et al. | |
| 2010/0227262 A1 | 9/2010 | Kobayashi et al. | |
| 2011/0132397 A1 | 6/2011 | Kumon et al. | |
| 2011/0143541 A1 | 6/2011 | Ogawa et al. | |
| 2011/0162680 A1 | 7/2011 | Saito et al. | |
| 2011/0214685 A1 | 9/2011 | Kumon et al. | |
| 2011/0269313 A1* | 11/2011 | Ogawa | H01L 21/0206 438/694 |
| 2012/0160273 A1 | 6/2012 | Mizutani et al. | |
| 2012/0164818 A1 | 6/2012 | Kumon et al. | |
| 2012/0276474 A1* | 11/2012 | Yamauchi | G03F 1/82 430/5 |

FOREIGN PATENT DOCUMENTS

| | | |
|---|---|---|
| JP | 2011-124410 | 6/2011 |
| JP | 2011-233774 | 11/2011 |
| JP | 2012-9802 | 1/2012 |
| WO | WO 2013/115021 A1 | 8/2013 |

OTHER PUBLICATIONS

Office Action dated Sep. 30, 2016 in Japanese Application No. 2013-007296 filed Jan. 18, 2013 (w/English translation).

\* cited by examiner

MANUFACTURING METHOD OF SEMICONDUCTOR DEVICE AND SEMICONDUCTOR MANUFACTURING APPARATUS

CROSS REFERENCE TO RELATED APPLICATIONS

This application is a continuation of and claims the benefit of priority under 35 U.S.C. § 120 from U.S. application Ser. No. 15/408,554 filed Jan. 18, 2017, which is a division of U.S. application Ser. No. 13/957,697 filed Aug. 2, 2013 (now U.S. Pat. No. 9,583,331 issued Feb. 28, 2017), and claims the benefit of priority under 35 U.S.C. § 119 from Japanese Patent Application No. 2013-007296 filed Jan. 18, 2013, the entire contents of each of which are incorporated herein by reference.

FIELD

The embodiments of the present invention relate to a manufacturing method of a semiconductor device and a semiconductor manufacturing apparatus.

BACKGROUND

Semiconductor device manufacturing processes include various processes such as a lithographic process, an etching process, and an ion implantation process. After the end of each process and before shifting to the next process, a cleaning process and a drying process are performed so as to remove impurities and residues remaining on the surface of a semiconductor substrate to clean the surface of the semiconductor substrate.

In recent years, following the downscaling of elements, the aspect ratio of patterns on a semiconductor substrate has become higher. At a higher aspect ratio, there occurs a problem that capillary causes collapsing of the patterns on the semiconductor substrate in the drying process.

To deal with such a problem, there has been proposed a technique for making surfaces of the patterns on the semiconductor substrate water repellent and lowering the capillary that acts between the patterns and a chemical liquid or the DIW (Deionized Water). However, a water-repellent agent used for making the surface of the semiconductor substrate water repellent is often deactivated after reacting to the water. For example, it often occurs in a cleaning device that the water-repellent agent is deactivated after reacting to the water in a chamber. If such deactivation of the water-repellent agent occurs, the water-repellent agent is unable to make the surface of the semiconductor substrate water repellent and to suppress collapsing of the patterns on the semiconductor substrate resulting from the capillary. Furthermore, if the water-repellent agent is deactivated while spreading throughout the surface of the semiconductor substrate, water repellency varies on the surface of the semiconductor substrate.

DETAILED DESCRIPTION

Embodiments will now be explained with reference to the accompanying drawings. The present invention is not limited to the embodiments.

A manufacturing method of a semiconductor device according to the present invention comprises cleaning a semiconductor substrate. A first chemical liquid for forming a water-repellent protection film and a second chemical liquid coating the first chemical liquid are supplied on a surface of the semiconductor substrate. Alternatively, the semiconductor substrate is immersed in the first chemical liquid coated with the second chemical liquid. The semiconductor substrate is then dried.

First Embodiment

Figure 1:
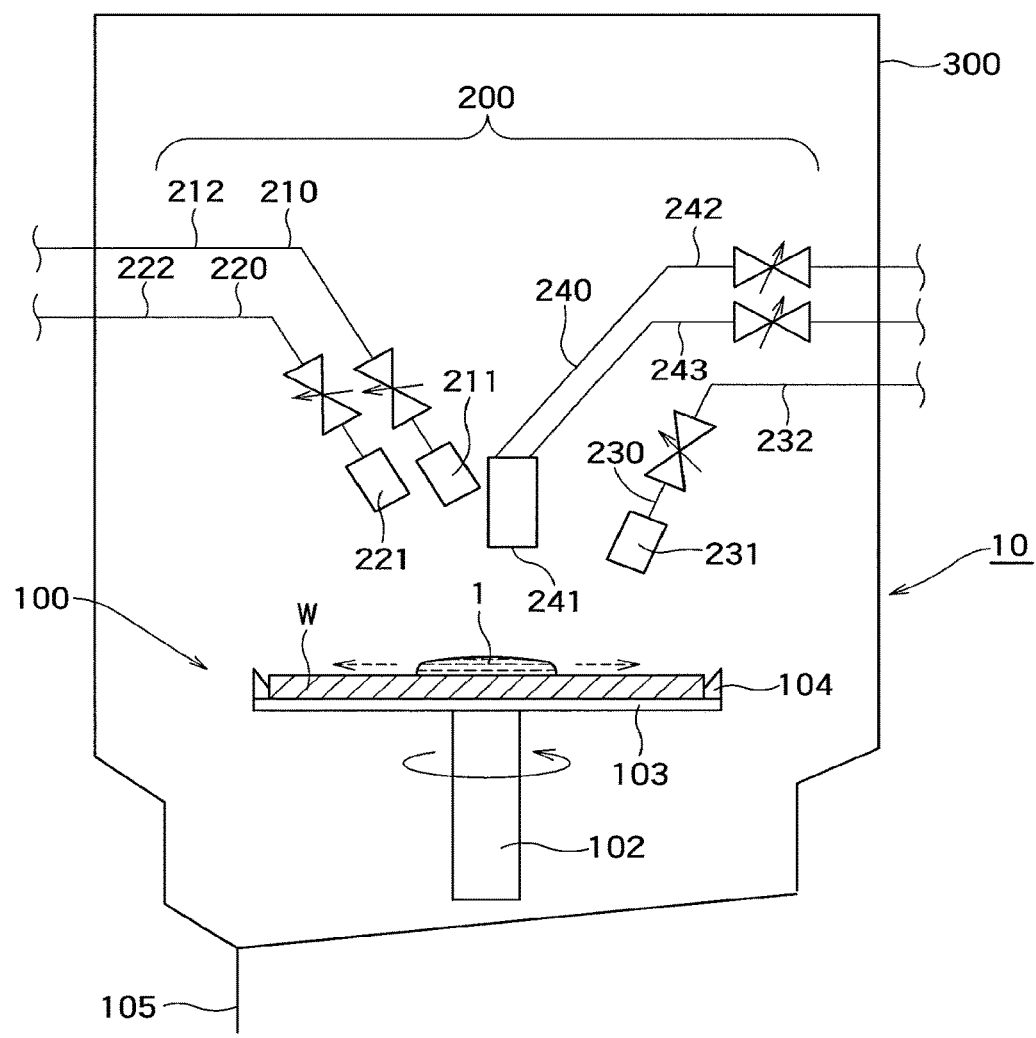
FIG. 1 shows an example of a configuration of a surface treatment apparatus 10 according to a first embodiment.

FIG. 1 shows an example of a configuration of a surface treatment apparatus 10 according to a first embodiment. The surface treatment apparatus 10 includes a mounting unit 100 that mounts a semiconductor substrate (a wafer) W, a liquid supply unit 200 that supplies liquids to the semiconductor substrate W, and a chamber 300 that hermetically seals the mounting unit 100 and the liquid supply unit 200. The surface treatment apparatus 10 is a single-wafer surface treatment apparatus that processes semiconductor substrates W one by one.

The mounting unit 100 includes a rotary shaft 102, a spin base 103, and chuck pins 104. The rotary shaft 102 extends substantially in a vertical direction and the disk-like spin base 103 is attached on an upper end of the rotary shaft 102. A motor (not shown) can rotate the rotary shaft 102 and the spin base 103.

The chuck pins 104 are provided on peripheral edges of the spin base 103, respectively. The chuck pins 104 fix the semiconductor substrate W on the spin base 103 by putting the semiconductor substrate W between the chuck pins 104. The mounting unit 100 can rotate the semiconductor substrate W while keeping the semiconductor substrate W substantially horizontally.

The liquid supply unit 200 discharges a liquid 1 to a surface of the semiconductor substrate W near a rotation center thereof. By allowing the mounting unit 100 to rotate the semiconductor substrate W, the discharged liquid 1 can spread in a radial direction of the semiconductor substrate W and can be applied on the surface of the semiconductor substrate W. Furthermore, by allowing the mounting unit 100 to rotate the semiconductor substrate W, the liquid 1 on the semiconductor substrate W can be drained off and the semiconductor substrate W can be spin-dried. The excessive liquid 1 spattering in the radial direction of the semiconductor substrate W is discharged via a waste liquid pipe 105. For example, the liquid 1 is a cleaning liquid, a water-repellent agent, DIW (deionized water) or an organic solvent.

The liquid supply unit 200 includes a cleaning-liquid supply unit 210 that supplies the cleaning liquid for cleaning the semiconductor substrate W to the surface of the semiconductor substrate W, a DIW supply unit 220 that supplies the DIW to the surface of the semiconductor substrate W, an IPA (isopropyl alcohol) supply unit 230 that supplies IPA to the surface of the semiconductor substrate W, and a chemical-liquid supply unit 240 that supplies a first chemical liquid for forming a water-repellent protection film and a second chemical liquid coating the first chemical liquid on the surface of the semiconductor substrate W.

The cleaning liquid supplied from the cleaning-liquid supply unit 210 passes through a supply pipe 212 and is discharged from a nozzle 211. For example, the cleaning liquid is an SC1 liquid (Ammonia-Hydrogen Peroxide mixture) or an SPM liquid (Sulfuric acid-Hydrogen Peroxide Mixture) and is a chemical liquid used for removing etching residues and the like.

The DIW supplied from the DIW supply unit 220 passes through a supply pipe 222 and is discharged from a nozzle 221. The DIW is used to rinse away a chemical liquid on the semiconductor substrate W.

The IPA supplied from the IPA supply unit 230 passes through a supply pipe 232 and is discharged from a nozzle 231. By supplying the IPA, the IPA displaces the liquid 1 on the semiconductor substrate W.

The first and second chemical liquids supplied from the chemical-liquid supply unit 240 pass through supply pipes 242 and 243, respectively, and are discharged from a nozzle 241. For example, the first chemical liquid is a water-repellent agent for forming a water-repellent protection film on surfaces of patterns formed on the semiconductor substrate W and making the surfaces of the semiconductor substrate W and the patterns water repellent.

The second chemical liquid is a chemical liquid that is lower in specific gravity than the first chemical liquid so as to coat the first chemical liquid with the second chemical liquid on the surfaces of the semiconductor substrate W and the patterns and that is not mixed with the first chemical liquid. The second chemical liquid is a chemical liquid that does not react to the first chemical liquid. For example, the first chemical liquid is a water-soluble water-repellent agent and the second chemical liquid is a water-insoluble chemical liquid. Because the second chemical liquid is the water-insoluble chemical liquid, the water in the chamber 300 is not dissolved in the second chemical liquid. Therefore, it is difficult for the water in the chamber 300 to reach the first chemical liquid. Because the first chemical liquid is soluble in water, the first chemical liquid is not mixed with the second chemical liquid.

Alternatively, the first chemical liquid can be a water-insoluble water-repellent agent and the second chemical liquid can be a water-soluble chemical liquid. In this alternative, while the second chemical liquid absorbs the water, the second chemical liquid coats the first chemical liquid and is not mixed with the first chemical liquid. Therefore, even in this case, the second chemical liquid can act to keep a water-repellent function of the first chemical liquid.

The second chemical liquid coats the first chemical liquid when the first and second chemical liquids are supplied on the semiconductor substrate W because the specific gravity of the second chemical liquid is lower than that of the first chemical liquid. That is, the second chemical liquid stands between the first chemical liquid and an atmosphere in the chamber 300. The second chemical liquid can thereby suppress the contact between the first chemical liquid and the water in the atmosphere in the chamber 300, and suppress the first chemical liquid from being deactivated. Because the second chemical liquid is not mixed with the first chemical liquid and does not react to the first chemical liquid, the second chemical liquid itself does not cause the loss of the water-repellent function of the first chemical liquid.

More specifically, the water-repellent agent serving as the first chemical liquid is a silane coupling agent. The silane coupling agent contains hydrolytic groups having an affinity and a reactivity to inorganic materials and organic functional groups chemically bonding organic materials in molecules. Examples of the silane coupling agent include Trichloro-3-chloropropyl silane, 3-Chloropropyltrimethoxysilane, and 3-(Methyldimethoxysilyl)propyl Chloride. These specific examples of the silane coupling agent are insoluble in water. Examples of the second chemical liquid include 3-(Dimethylamino)propylamine, 3-Aminopropyl Methyl Ether, and Bis(2-ethoxyethyl) Ether. These specific examples of the second chemical liquid are soluble in water. To make the surfaces of the semiconductor substrate W and the patterns water repellent is described later with reference to FIG. 4.

The surface treatment apparatus 10 can include a vacuum device (not shown) that evacuates the air from an interior of the chamber 300. In this case, the vacuum device discharges the water in the chamber 300 to outside to some extent and the second chemical liquid suppresses the contact between the first chemical liquid and the water remaining in the chamber 300. It is thereby possible to keep the water-repellent function of the first chemical liquid for a longer time.

Furthermore, the surface treatment apparatus 10 can include an excimer UV (ultraviolet) irradiation unit (not shown). The excimer UV irradiation unit can selectively remove the water-repellent protection film by irradiating UV light on the semiconductor substrate W.

Figure 2:
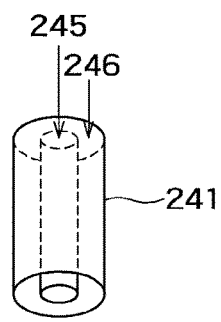
FIG. 2 shows a structure of the chemical-liquid supply unit 240 in more detail.

FIG. 2 shows a structure of the chemical-liquid supply unit 240 in more detail. The nozzle 241 of the chemical-liquid supply unit 240 has a double piping structure including a first pipe 245 that supplies the first chemical liquid and a second pipe 246 that supplies the second chemical liquid. The first pipe 245 connects to the supply pipe 242 and transports the first chemical liquid. The second pipe 246 connects to the supply pipe 243 and transports the second chemical liquid. The second pipe 246 is provided to surround an outer circumference of the first pipe 245. In the first embodiment, the first pipe 245 and the second pipe 246 are formed concentrically in cross-sections in a perpendicular direction to a direction in which the first and second chemical liquids flow. Needless to mention, cross-sectional shapes of the first pipe 245 and the second pipe 246 are not limited to circles. However, it is preferable that the first pipe 245 and the second pipe 246 are similar in shape in the cross-sections in the perpendicular direction because the second pipe 246 surrounds the outer circumference of the first pipe 245. By allowing the second pipe 246 to surround the outer circumference of the first pipe 245 as described above, the first and second chemical liquids are supplied on the semiconductor substrate W in a state where the second chemical liquid surrounds the first chemical liquid. The first chemical liquid can be thereby coated with the second chemical liquid soon after the first chemical liquid is supplied from the first pipe 245.

Figure 3A:
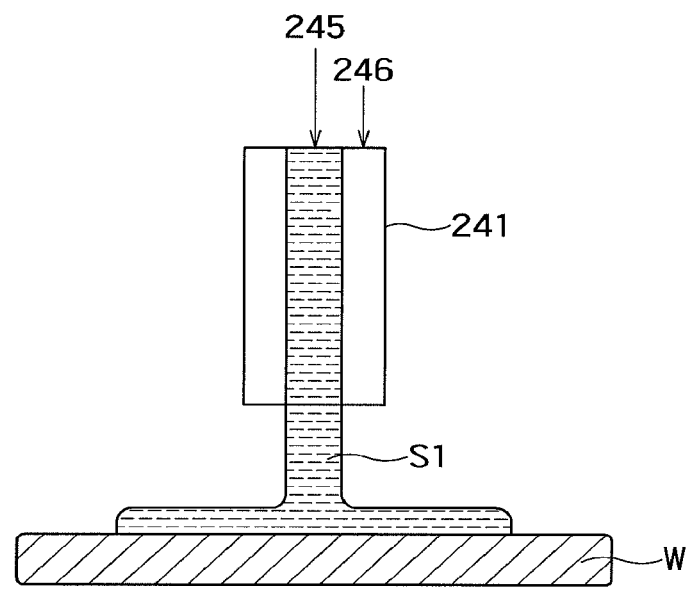
FIGS. 3A and 3B shows states where the chemical-liquid supply unit 240 supplies the first and second chemical liquids on the semiconductor substrate W.
Figure 3B:
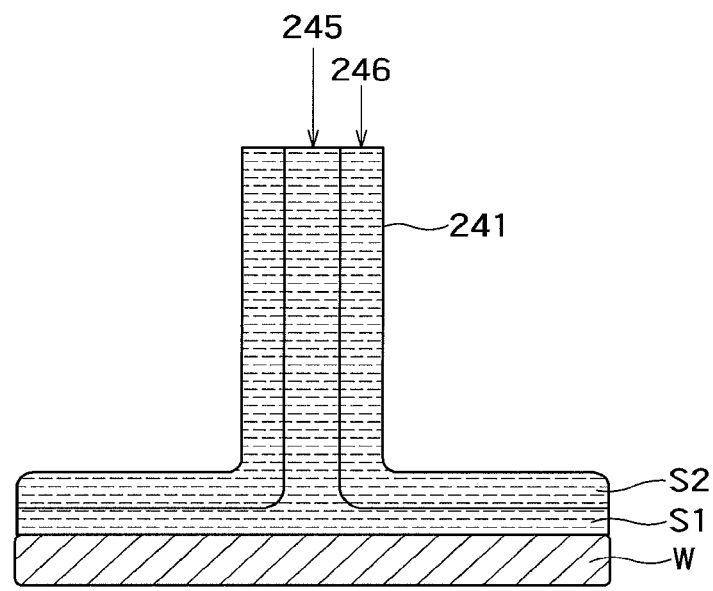

FIGS. 3A and 3B shows states where the chemical-liquid supply unit 240 supplies the first and second chemical liquids on the semiconductor substrate W. In FIGS. 3A and 3B, reference character S1 denotes the first chemical liquid and reference character S2 denotes the second chemical liquid for the sake of convenience. The chemical-liquid supply unit 240 can supply the second chemical liquid S2 on the surface of the semiconductor substrate W after supplying the first chemical liquid S1 on the surface thereof. First, as shown in FIG. 3A, the chemical-liquid supply unit 240 supplies the first chemical liquid S1 to the surface of the semiconductor substrate W via the first pipe 245. Thereafter, as shown in FIG. 3B, the chemical-liquid supply unit 240 supplies the second chemical liquid S2 to the surface of the semiconductor substrate W via the second pipe 246. At this time, the second chemical liquid S2 is supplied in a state of surrounding the first chemical liquid S1. Furthermore, the second chemical liquid S2 spreads on the surface of the semiconductor substrate W in a state of coating the first chemical liquid S1 because the second chemical liquid S2 is lower in specific gravity than the first chemical liquid S1. This can reduce the time required for the first chemical liquid S1 to contact the atmosphere in the chamber 300. Therefore, the first chemical liquid S1 can spread on the surface of the semiconductor substrate W without being deactivated by a reaction to the water in the chamber 300.

Alternatively, the chemical-liquid supply unit 240 can simultaneously supply the first chemical liquid S1 and the second chemical liquid S2 on the surface of the semiconductor substrate W. In this alternative, the chemical-liquid supply unit 240 supplies the second chemical liquid S2 in a state of surrounding the first chemical liquid S1 from the beginning of the supply of the first chemical liquid S1 to the semiconductor substrate W. The first chemical liquid S1 can thereby spread on the surface of the semiconductor substrate W without being deactivated by the reaction to the water in the chamber 300.

Figure 4:
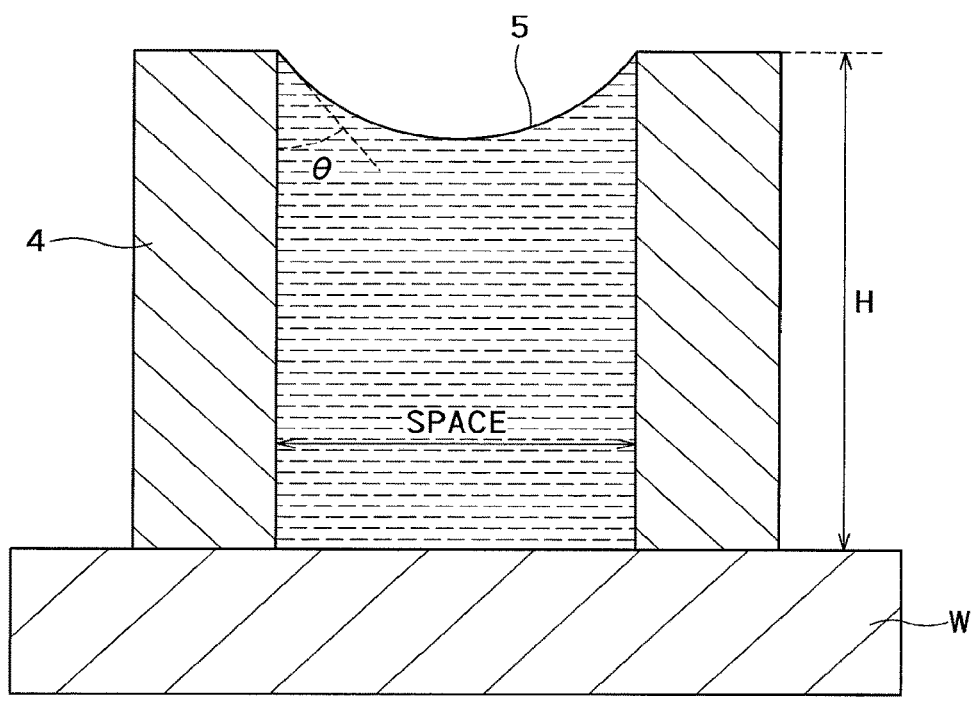
FIG. 4 shows a contact angle θ of a liquid on patterns 4 on the semiconductor substrate W.

FIG. 4 shows a contact angle θ of a liquid on patterns 4 on the semiconductor substrate W. When an aspect ratio of the patterns 4 becomes higher by downscaling the patterns 4, a liquid 5 enters between adjacent patterns 4 by the capillary of the liquid 5. In this case, power P with which the liquid 5 acts on the patterns 4 is represented by the following Equation (1).

$$P = 2 \times \gamma \times \cos\theta \cdot H / \text{SPACE} \tag{1}$$

In this equation, SPACE denotes a space between adjacent patterns 4. H denotes the height of each pattern 4. γ denotes the surface tension of the liquid 5.

It is understood that as the contact angle θ is closer to 90°, then cos θ becomes closer to zero and the power P acting on the patterns 4 becomes lower. The fact that the contact angle θ is closer to 90° means that the surface of the semiconductor substrate W (the surface of each pattern 4) is made water repellent. Therefore, pattern collapsing can be suppressed by making the surface of the semiconductor substrate W water repellent.

To make the surface of the semiconductor substrate W water repellent, the water-repellent protection film is formed on the surface of the semiconductor substrate W using the water-repellent agent such as the silane coupling agent. However, when the water is present in the chamber 300, the silane coupling agent has a hydrolytic reaction to the water in the chamber 300 and loses a water-repellent function. That is, the silane coupling agent is deactivated. For example, when the silane coupling agent is supplied to the rotation center of the semiconductor substrate W shown in FIG. 1, it is likely that the silane coupling agent reacts to the water and is deactivated before the silane coupling agent spreads through peripheral edges of the semiconductor substrate W. In this case, the water-repellent protection film is formed on the patterns 4 near a central portion of the semiconductor substrate W but not on the patterns 4 near the peripheral edges of the semiconductor substrate W.

On the other hand, according to the first embodiment, the chemical-liquid supply unit 240 supplies the second chemical liquid with which the first chemical liquid S1 is coated simultaneously with or right after the supply of the water-repellent agent serving as the first chemical liquid. The second chemical liquid suppresses the contact between the first chemical liquid and the water in the chamber 300. The first chemical liquid can thereby spread throughout the surface of the semiconductor substrate W without the loss of the water-repellent function. As a result, it is possible to ensure making the surface of the semiconductor substrate W and the surfaces of the patterns 4 water repellent, to make the contact angle θ closer to 90°, and to suppress collapsing of the patterns 4 on the semiconductor substrate W.

Figure 5:
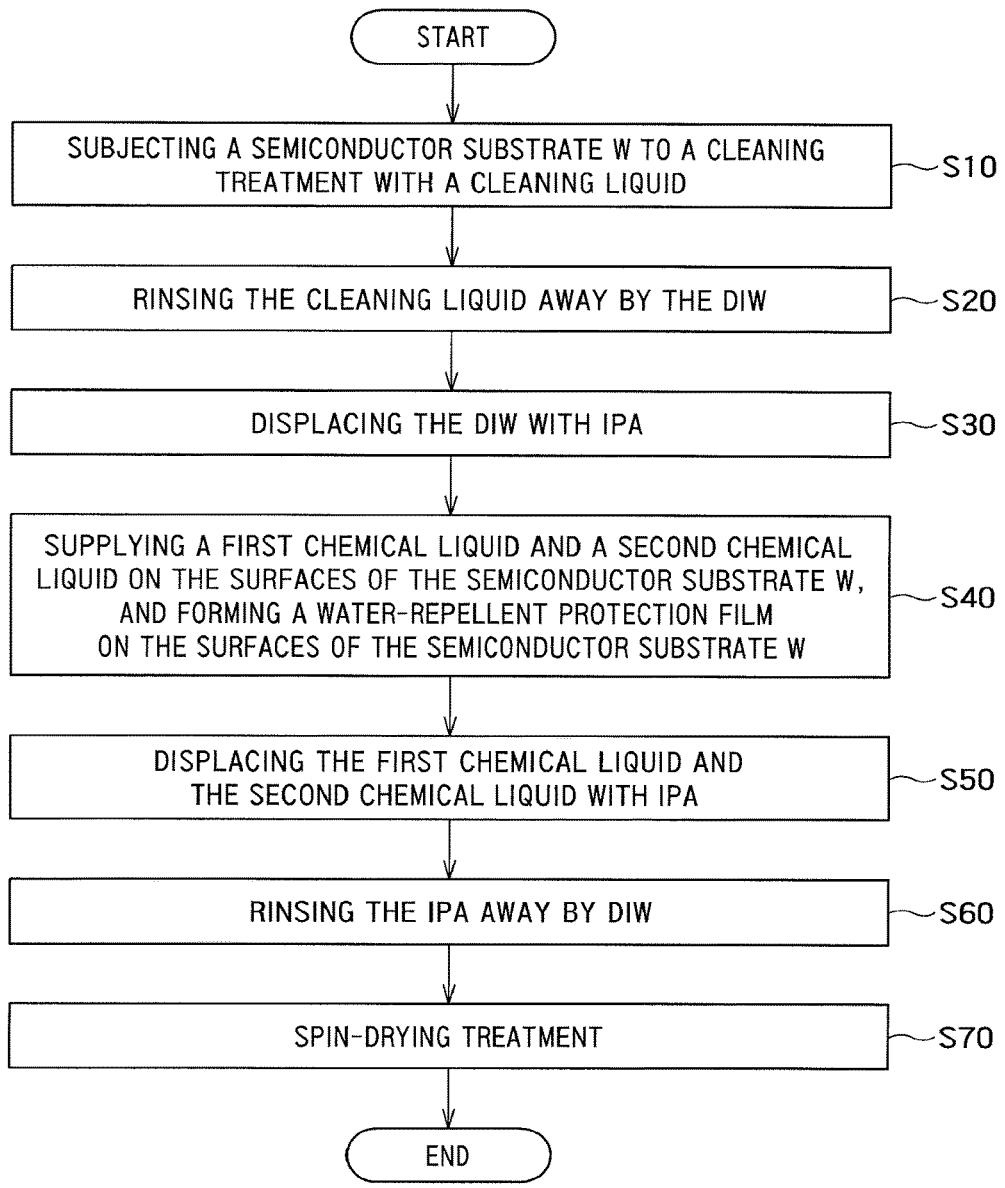
FIG. 5 is a flowchart showing a surface treatment method according to the first embodiment.

FIG. 5 is a flowchart showing a surface treatment method according to the first embodiment. A control unit (not shown) can control the mounting unit 100 and the liquid supply unit 200 to operate.

First, the semiconductor substrate W is mounted on the mounting unit 100. Patterns are formed on the surface of the semiconductor substrate W. For example, line-and-space patterns formed by a RIE (Reactive Ion Etching) method can be formed as the patterns. Alternatively, resist patterns formed by a lithographic technique can be formed as the patterns.

The semiconductor substrate W is rotated at a predetermined rotational speed, and the cleaning-liquid supply unit 210 supplies the cleaning liquid to the surface of the semiconductor substrate W near the rotation center thereof. The cleaning liquid receives a centrifugal force generated by the rotation of the semiconductor substrate W and spreads throughout the surface of the semiconductor substrate W. The semiconductor substrate W is thereby subjected to a cleaning treatment (S10). For example, the cleaning treatment removes etching residues generated as a result of the RIE method. In a case of cleaning the resist patterns, a resist-insoluble chemical liquid is used as the cleaning liquid.

Next, the DIW supply unit 220 supplies the DIW to the surface of the semiconductor substrate W near the rotation center thereof. The DIW receives the centrifugal force generated by the rotation of the semiconductor substrate W and spreads throughout the semiconductor substrate W. The cleaning liquid remaining on the surface of the semiconductor substrate W is thereby rinsed away by the DIW (S20: DIW rinse treatment).

The IPA supply unit 230 then supplies the IPA to the surface of the semiconductor substrate W near the rotation center thereof. The IPA receives the centrifugal force generated by the rotation of the semiconductor substrate W and spreads throughout the surface of the semiconductor substrate W. The DIW remaining on the surface of the semiconductor substrate W is thereby rinsed away by the IPA (S30: alcohol rinse treatment).

Next, the chemical-liquid supply unit 240 supplies the first and second chemical liquids to the surface of the semiconductor substrate W near the rotation center thereof. The first and second chemical liquids receive the centrifugal force generated by the rotation of the semiconductor substrate W and spread throughout the surface of the semiconductor substrate W. At this time, the first and second chemical liquids can be supplied simultaneously. Alternatively, the second chemical liquid can be supplied after the supply of the first chemical liquid. The first chemical liquid is the silane coupling agent and forms the water-repellent protection film on the surfaces of the semiconductor substrate W and the patterns (S40: sililation treatment). For example, the first chemical liquid is Trichloro-3-chloropropyl silane, 3-Chloropropyltrimethoxysilane or 3-(Methyldimethoxysilyl)propyl Chloride. For example, the second chemical liquid is 3-(Dimethylamino)propylamine, 3-Aminopropyl Methyl Ether or Bis(2-ethoxyethyl) Ether. The second chemical liquid coats the first chemical liquid and is not mixed with the first chemical liquid. Therefore, the second chemical liquid enables the first chemical liquid to spread throughout the surface of the semiconductor substrate W without deactivating the water-repellent function of the first chemical liquid.

The water-repellent protection film is formed by occurrence of a sililation reaction of the silane coupling agent. Therefore, the liquid temperature can be raised by performing an annealing treatment, or the reaction can be accelerated by causing the excimer UV irradiation unit to irradiate the UV light on the semiconductor substrate W.

Furthermore, when the patterns on the semiconductor substrate W are formed of a silicon-based film such as a silicon nitride film or a polysilicon film, sufficient water repellency is not often ensured because of an insufficient sililation reaction even after the sililation treatment using the silane coupling agent. In this case, before Step S40, the surfaces of the silicon-based patterns are changed to silicon oxide-based chemical oxide films using another chemical liquid. When the sililation treatment is subsequently performed, it is possible to improve water repellency after the sililation treatment.

Many residues are generated after the etching by the RIE method. It is difficult to form the water-repellent protection film in a state where many residues remain. Therefore, it is effective to remove the residues by the cleaning treatment so as to form the water-repellent protection film. In addition, plasma damages are accumulated on the surfaces of the patterns by the RIE method and dangling bonds are generated. When a reforming treatment is performed using a cleaning liquid having an oxidation effect, the dangling bonds terminate at OH groups. If many OH groups are present, the sililation reaction probability increases, which facilitates forming the water-repellent protection film. This can further improve the water repellency. Even when the patterns are formed of the silicon oxide film, identical effects can be obtained. When the cleaning liquid has also a reforming effect (an oxidation effect), it is possible to simultaneously perform the cleaning treatment and the reforming treatment using the single cleaning liquid.

Next, the IPA supply unit 230 supplies the IPA to the surface of the semiconductor substrate W near the rotation center thereof. The IPA receives the centrifugal force generated by the rotation of the semiconductor substrate W and spreads throughout the surface of the semiconductor substrate W. The first and second chemical liquids remaining on the surface of the semiconductor substrate W are thereby rinsed away by the IPA (S50: alcohol rinse treatment).

Next, the DIW supply unit 220 supplies the DIW to the surface of the semiconductor substrate W near the rotation center thereof. The DIW receives the centrifugal force generated by the rotation of the semiconductor substrate W and spreads throughout the semiconductor substrate W. The IPA remaining on the surface of the semiconductor substrate W is thereby rinsed away by the DIW (S60: DIW rinse treatment).

A drying treatment is then performed on the semiconductor substrate W. For example, the rotational speed for rotating the semiconductor substrate W is accelerated to a predetermined spin-drying rotational speed, and the DIW remaining on the surface of the semiconductor substrate W is drained off and the semiconductor substrate W is thereby dried (S70: spin-drying treatment).

In this manner, the water-repellent protection film is formed on the surfaces of the patterns of the semiconductor substrate W and the surfaces of the patterns on the semiconductor substrate W are made water repellent.

In the first embodiment, the second chemical liquid suppresses the contact between the first chemical liquid and the water in the atmosphere in the chamber 300 by coating the first chemical liquid with the second chemical liquid. It is thereby possible to suppress the first chemical liquid from being deactivated and to make the patterns on the entire surface of the semiconductor substrate W water repellent. That is, the water repellency does not vary on the surfaces of the semiconductor substrate W and the patterns and the water-repellent protection film is uniformly formed on the surfaces of the patterns. As a result, according to the first embodiment, the cleaning treatment and the drying treatment can be performed on the semiconductor substrate W while suppressing collapsing of the patterns on the semiconductor substrate W.

Second Embodiment

Figure 6:
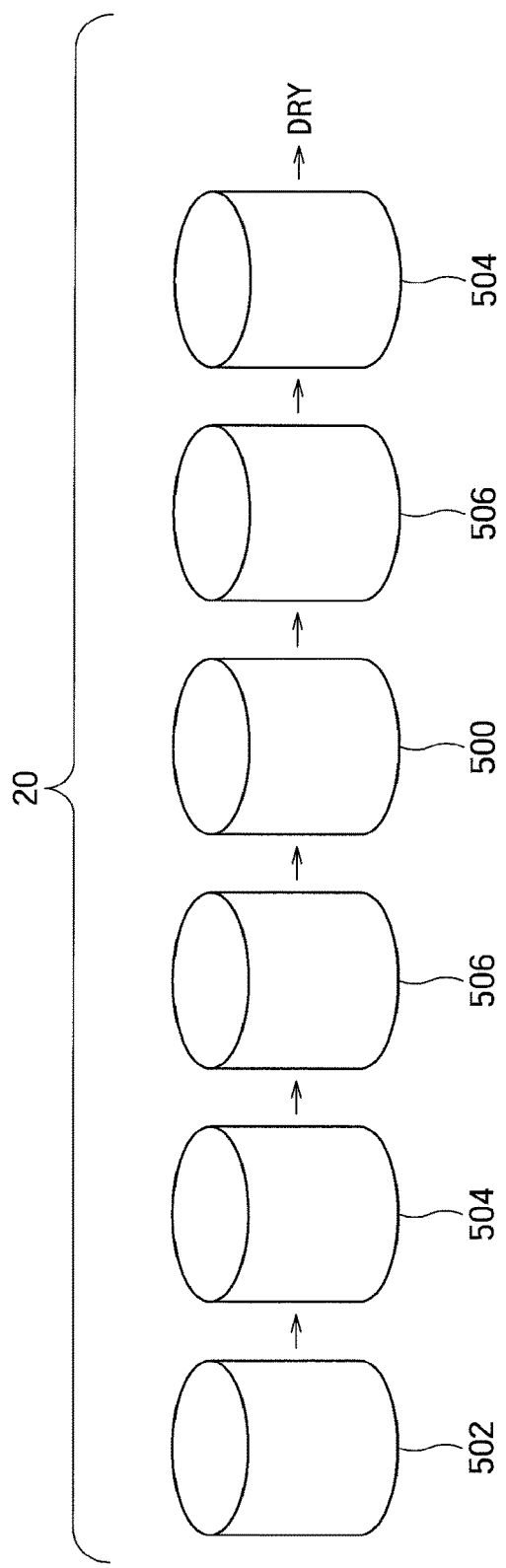
FIG. 6 shows a surface treatment apparatus 20 and a surface treatment method according to a second embodiment.

FIG. 6 shows a surface treatment apparatus 20 and a surface treatment method according to a second embodiment. The surface treatment apparatus 20 according to the second embodiment performs processes in Steps S10 to S60 shown in FIG. 5 all by batch processing. That is, the surface treatment apparatus 20 processes a plurality of semiconductor substrates W (semiconductor substrates W corresponding to two lots, for example) simultaneously as one batch. As shown in FIG. 6, the surface treatment apparatus 20 includes a cleaning bath 502 storing therein the cleaning liquid, DIW baths 504 storing therein the DIW, IPA baths 506 storing therein the IPA, and a chemical-liquid bath 500 storing therein the first and second chemical liquids. At the time of performing the drying treatment on the semiconductor substrates W, the semiconductor substrates W are immersed in the cleaning bath 502, the DIW bath 504, the IPA bath 506, the chemical-liquid bath 500, the IPA bath 506, and the DIW bath 504 in this order for every batch. At this time, the mounting unit 10 can move among the baths 502, 504, 506, 500, 506, and 504 while mounting thereon the semiconductor substrates W so that the semiconductor substrates W can be continuously immersed in these baths. Thereafter, the semiconductor substrates W are pulled out of the DIW bath 504 and subjected to evaporative drying by supplying the dry air to the semiconductor substrates W from a gas supply unit (not shown). The semiconductor substrates W are thereby completed with the cleaning treatment and the drying treatment. Alternatively, the semiconductor substrates W can be subjected to drying under reduced pressure.

Furthermore, while FIG. 6 shows the two DIW baths 504 and the two IPA baths 506, the surface treatment apparatus 20 can include one DIW bath 504 and one IPA bath 506. That is, the common DIW bath 504 and the common IPA bath 506 can be used. The surface treatment apparatus 20 can be thereby made smaller in size. Needless to mention, the surface treatment apparatus 20 can include the two DIW baths 504 and the two IPA baths 506. With this configuration, by sequentially moving the batch of the semiconductor substrates W to the adjacent baths, the cleaning treatment and the drying treatment can be performed as a series of operations (sequential operations). In this case, the surface treatment apparatus 20 can process many batches continuously and swiftly.

Figure 7A:
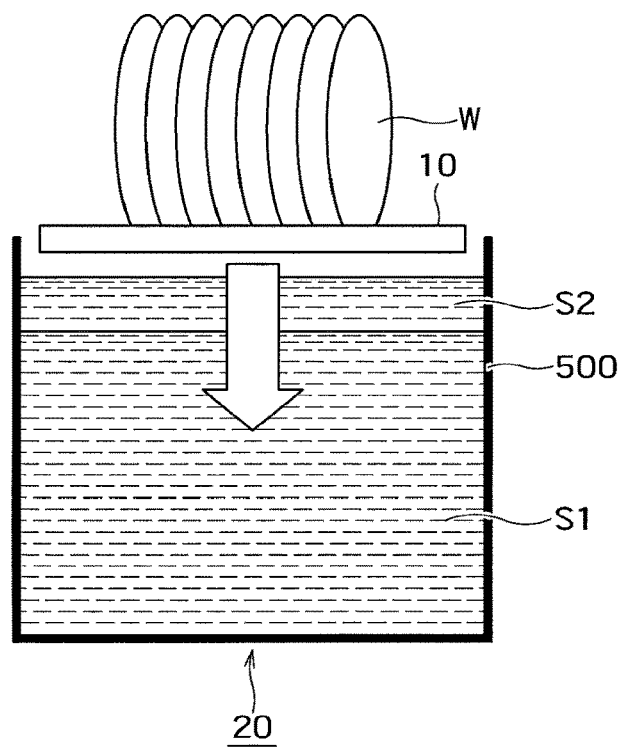
FIGS. 7A and 7B show a configuration of the chemical-liquid bath 500 in the surface treatment apparatus 20 and the surface treatment method according to the second embodiment.
Figure 7B:
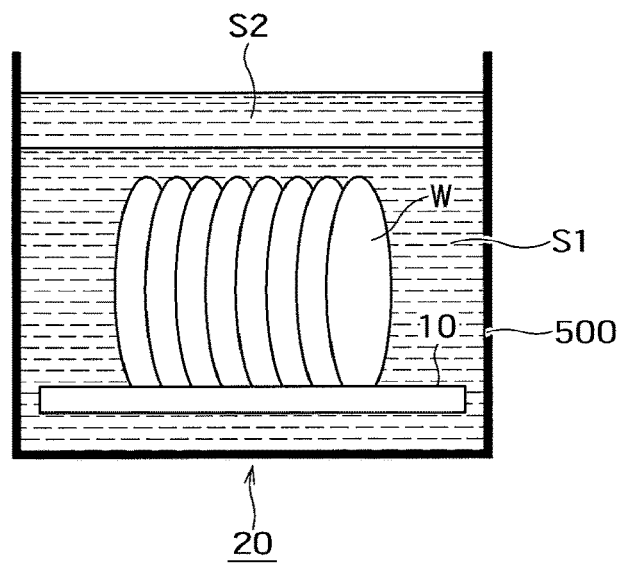

FIGS. 7A and 7B show a configuration of the chemical-liquid bath 500 in the surface treatment apparatus 20 and the surface treatment method according to the second embodiment. In FIGS. 7A and 7B, reference character S1 denotes the first chemical liquid and reference character S2 denotes the second chemical liquid for the sake of convenience. The chemical-liquid bath 500 stores therein the first chemical liquid S1 and the second chemical liquid S2. The chemical-liquid bath 500 can immerse each batch of the semiconductor substrates W in the first chemical liquid S1 while mounting the batch on the mounting unit 10. That is, the chemical-liquid bath 500 can perform a water-repellent treatment on a plurality of semiconductor substrates W (a batch thereof) at a time.

The chemical-liquid bath 500 can also include a heater unit (not shown). The heater unit can accelerate the sililation reaction by heating the chemical liquids S1 and S2.

The first and second chemical liquids S1 and S2 that are same as those in the first embodiment can be used. Therefore, the second chemical liquid S2 is lower in specific gravity than the first chemical liquid S1, and the first chemical liquid S1 is coated with the second chemical liquid S2 in the chemical-liquid bath 500. The first chemical liquid S1 is the water-soluble water-repellent agent and the second chemical liquid S2 is the water-insoluble chemical liquid. Alternatively, the first chemical liquid S1 is the water-insoluble water-repellent agent and the second chemical liquid S2 is the water-soluble chemical liquid. Accordingly, the first and second chemical liquids S1 and S2 are not mixed with each other. The second chemical liquid S2 thereby suppresses the contact between an atmosphere outside of the chemical-liquid bath 500 and the first chemical liquid S1 and suppresses a reaction between the first chemical liquid S1 and the outside water. As a result, the first chemical liquid S1 can keep the water-repellent function for a long time. The second chemical liquid S2 can be supplied on the first chemical liquid S1 after immersing the batch of the semiconductor substrates W in the first chemical liquid S1. The semiconductor substrates W can be thereby immersed in the first chemical liquid S1 without contacting the second chemical liquid S2.

In this manner, while batch processing is performed in the surface treatment apparatus 20 and by the surface treatment method according to the second embodiment, the second embodiment can achieve effects identical to those of the first embodiment.

The surface treatment apparatus and the surface treatment method according to each of these embodiments are applicable to, for example, various patterns on the semiconductor substrates W such as sidewall mask patterns, hard mask patterns or resist patterns in a sidewall transfer process used when manufacturing a NAND flash memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A surface treatment method of a semiconductor substrate comprising:
   cleaning a semiconductor substrate;
   rinsing the surface of the semiconductor substrate with deionized water;
   displacing the deionized water with alcohol;
   supplying a first chemical liquid for forming a water-repellent protection film on a surface of the semiconductor substrate and a second chemical liquid for coating the first chemical liquid coating the surface of the semiconductor substrate, the second chemical liquid not being mixed with the first chemical liquid and not reacting to the first chemical liquid, the first chemical liquid being below the second chemical liquid, and the second chemical liquid preventing the first chemical liquid from contacting with water in an atmosphere around the semiconductor substrate; and
   displacing the first chemical liquid and the second chemical liquid with alcohol;
   rinsing the alcohol with deionized water; and
   drying the semiconductor substrate rinsed with the deionized water, wherein
   the first chemical liquid is an insoluble water-repellent agent and the second chemical liquid is a soluble chemical liquid,
   a specific gravity of the second chemical liquid is lower than a specific gravity of the first chemical liquid.

2. The method of claim 1, wherein the first chemical liquid is a silane coupling agent.

3. The method of claim 1, wherein the method is performed by a semiconductor processing apparatus comprising:
   a cleaning-liquid supply part supplying a cleaning liquid cleaning a semiconductor substrate to a surface of the semiconductor substrate; and
   a chemical-liquid supply part supplying a first chemical liquid for forming a water-repellent protection film and a second chemical liquid coating the first chemical liquid on the surface of the semiconductor substrate without mixing with the first chemical liquid, wherein
   the chemical-liquid supply part has a double piping structure comprising a first pipe supplying the first chemical liquid and a second pipe supplying the second chemical liquid, wherein the second pipe is provided to surround an outer circumference of the first pipe.

4. The method of claim 1, wherein the method is performed by a semiconductor processing apparatus comprising:
   a cleaning-liquid supply part supplying a cleaning liquid cleaning a semiconductor substrate to a surface of the semiconductor substrate; and
   a chemical-liquid supply part supplying a first chemical liquid for forming a water-repellent protection film and a second chemical liquid coating the first chemical liquid on the surface of the semiconductor substrate, wherein
   the chemical-liquid supply part has a double piping structure comprising a first pipe supplying the first chemical liquid and a second pipe supplying the second chemical liquid.

5. The method of claim 1, further comprising rotating the substrate while supplying a first chemical liquid for forming a water-repellent protection film on a surface of the semiconductor substrate and a second chemical liquid for coating the first chemical liquid.

6. The method of claim 5, wherein supplying a first chemical liquid for forming a water-repellent protection film and the second chemical liquid for coating the first chemical liquid near the rotation center of the semiconductor substrate.

7. The method of claim 1, wherein supplying the second chemical liquid for coating the first chemical liquid is performed right after the supplying a first chemical liquid for forming a water-repellent protection film.

8. A surface treatment method of a semiconductor substrate comprising: cleaning a semiconductor substrate; rinsing the surface of the semiconductor substrate with deionized water; displacing the deionized water with alcohol; supplying a first chemical liquid for forming a water-repellent protection film on a surface of the semiconductor substrate and a second chemical liquid for coating the first chemical liquid coating the surface of the semiconductor substrate, the second chemical liquid not being mixed with the first chemical liquid and not reacting to the first chemical liquid, the first chemical liquid being below the second chemical liquid, and the second chemical liquid preventing the first chemical liquid from contacting with water in an atmosphere around the semiconductor substrate; and displacing the first chemical liquid and the second chemical liquid with alcohol; rinsing the alcohol with deionized water; and drying the semiconductor substrate rinsed with the deionized water, wherein the first chemical liquid is a water-soluble water-repellent agent, and the second chemical liquid is a water-insoluble chemical liquid, a specific gravity of the second chemical liquid is lower than a specific gravity of the first chemical liquid.

9. The method of claim 8, wherein the method is performed by a semiconductor processing apparatus comprising:
   a cleaning-liquid supply part supplying a cleaning liquid cleaning a semiconductor substrate to a surface of the semiconductor substrate; and
   a chemical-liquid supply part supplying a first chemical liquid for forming a water-repellent protection film and a second chemical liquid coating the first chemical liquid on the surface of the semiconductor substrate without mixing with the first chemical liquid, wherein
   the chemical-liquid supply part has a double piping structure comprising a first pipe supplying the first chemical liquid and a second pipe supplying the second chemical liquid, wherein the second pipe is provided to surround an outer circumference of the first pipe.

10. The method of claim 8, wherein the method is performed by a semiconductor processing apparatus comprising:
   a cleaning-liquid supply part supplying a cleaning liquid cleaning a semiconductor substrate to a surface of the semiconductor substrate; and
   a chemical-liquid supply part supplying a first chemical liquid for forming a water-repellent protection film and a second chemical liquid coating the first chemical liquid on the surface of the semiconductor substrate, wherein
   the chemical-liquid supply part has a double piping structure comprising a first pipe supplying the first chemical liquid and a second pipe supplying the second chemical liquid.

11. The method of claim 8, further comprising rotating the substrate while supplying a first chemical liquid for forming a water-repellent protection film on a surface of the semiconductor substrate and a second chemical liquid for coating the first chemical liquid.

12. The method of claim 8, wherein supplying a first chemical liquid for forming a water-repellent protection film and the second chemical liquid for coating the first chemical liquid near the rotation center of the semiconductor substrate.

13. The method of claim 8, wherein supplying the second chemical liquid for coating the first chemical liquid is performed right after the supplying a first chemical liquid for forming a water-repellent protection film.

14. A surface treatment method of a semiconductor substrate comprising:
   cleaning a semiconductor substrate;
   immersing the semiconductor substrate into deionized water bath and isopropyl alcohol bath;
   immersing the semiconductor substrate through a second chemical liquid into a first chemical liquid in a chemical-liquid bath, the first chemical liquid being coated with the second chemical liquid in the chemical-liquid bath, the second chemical liquid not being mixed with the first chemical liquid and not reacting to the first chemical liquid, and the first chemical liquid being below the second chemical liquid;
   immersing the semiconductor substrate into isopropyl alcohol bath and deionized water bath; and
   drying the semiconductor substrate, wherein
   the first chemical liquid is a soluble water-repellent agent and the second chemical liquid is an insoluble chemical liquid, or the first chemical liquid is an insoluble water-repellent agent and the second chemical liquid is a soluble chemical liquid,
   a specific gravity of the second chemical liquid is lower than a specific gravity of the first chemical liquid, and
   the first chemical liquid is a silane coupling agent.

* * * * *